United States Patent
Cho et al.

(10) Patent No.: US 12,451,368 B2
(45) Date of Patent: Oct. 21, 2025

(54) PROCESS STOP LOSS REDUCTION SYSTEM THROUGH RAPID REPLACEMENT OF APPARATUS FOR TRAPPING OF REACTION BY-PRODUCT FOR SEMICONDUCTOR PROCESS

(71) Applicant: MILAEBO CO., LTD., Pyeongtaek-si (KR)

(72) Inventors: Che Hoo Cho, Seoul (KR); Yeon Ju Lee, Hwaseong-si (KR); In Hwan Kim, Osan-si (KR); Sung Won Yoon, Siheung-si (KR)

(73) Assignee: MILAEBO CO., LTD., Pyeongtaek-si (KR)

( * ) Notice: Subject to any disclaimer, the term of this patent is extended or adjusted under 35 U.S.C. 154(b) by 357 days.

(21) Appl. No.: 18/296,204

(22) Filed: Apr. 5, 2023

(65) Prior Publication Data

US 2024/0063031 A1  Feb. 22, 2024

(30) Foreign Application Priority Data

Aug. 18, 2022  (KR) .................. 10-2022-0103093

(51) Int. Cl.
   *H01L 21/67*    (2006.01)
   *B01D 53/04*    (2006.01)
   *C23C 16/44*    (2006.01)

(52) U.S. Cl.
   CPC .... *H01L 21/67017* (2013.01); *B01D 53/0438* (2013.01); *B01D 53/0446* (2013.01);
   (Continued)

(58) Field of Classification Search
   CPC .......... C23C 16/4412; H01L 21/67017; B01D 53/0438; B01D 53/0446; B01D 53/0454;
   (Continued)

(56) References Cited

U.S. PATENT DOCUMENTS

2005/0081786 A1* 4/2005 Kubista ............... C23C 16/4412
                                                          118/715
2024/0186154 A1* 6/2024 Lee ................... H01J 37/32844

FOREIGN PATENT DOCUMENTS

CN        1788106 A     6/2006
JP     10-284474 A     10/1998
                    (Continued)

*Primary Examiner* — Robert Clemente
(74) *Attorney, Agent, or Firm* — YOU & IP, LLC; Wansik You

(57) ABSTRACT

Disclosed is a process stop loss reduction system, in which in case that pressure in a trapping apparatus and pressure in a process chamber are increased because of space clogging or the like caused by reaction by-products while the trapping apparatus for trapping of a reaction by-product contained in exhaust gas discharged from the process chamber operates over a long period of time during a semiconductor process, only the trapping apparatus, to which a supply of exhaust gas is cut off, may be quickly replaced while inert gas is received in an idle state and continuously supplied to a vacuum pump through a bypass pipe of the trapping apparatus without stopping an operation of (shutting down) a semiconductor manufacturing process chamber facility, and then the trapping apparatus may be supplied with the exhaust gas again.

6 Claims, 5 Drawing Sheets

(52) U.S. Cl.
CPC ...... *B01D 53/0454* (2013.01); *C23C 16/4412* (2013.01); *B01D 2257/204* (2013.01); *B01D 2257/406* (2013.01); *B01D 2257/553* (2013.01); *B01D 2257/60* (2013.01); *B01D 2258/0216* (2013.01)

(58) Field of Classification Search
CPC ........ B01D 2257/204; B01D 2257/406; B01D 2257/553; B01D 2257/60; B01D 2258/0216
See application file for complete search history.

(56) References Cited

FOREIGN PATENT DOCUMENTS

| | | | | |
|---|---|---|---|---|
| JP | H10284474 | A | * 10/1998 | |
| JP | 2000106347 | A | * 4/2000 | ......... C23C 16/4401 |
| KR | 10-0544320 | B1 | 1/2006 | |
| KR | 100553194 | B1 | * 2/2006 | |
| KR | 10-0647725 | B1 | 11/2006 | |
| KR | 10-0930320 | B1 | 12/2009 | |
| KR | 10-2010-0011823 | A | 2/2010 | |
| KR | 10-2011-0097395 | A | 8/2011 | |
| KR | 10-2022-0081116 | | 6/2022 | |
| TW | 201530026 | A | 8/2015 | |

* cited by examiner

PROCESS STOP LOSS REDUCTION SYSTEM THROUGH RAPID REPLACEMENT OF APPARATUS FOR TRAPPING OF REACTION BY-PRODUCT FOR SEMICONDUCTOR PROCESS

CROSS-REFERENCE TO RELATED APPLICATIONS

This application claims the priority of Korean Patent Application No. 10-2022-0103093 filed on Aug. 18, 2022, in the Korean Intellectual Property Office, the disclosure of which is incorporated herein by reference.

BACKGROUND

Field

The present disclosure relates to a process stop loss reduction system through rapid replacement of an apparatus for trapping of a reaction by-product for a semiconductor process, and more particularly, to a process stop loss reduction system capable of proceeding with semiconductor production by quickly replacing a trapping apparatus without a process stop loss such as preparation of replacement of the trapping apparatus and replacement and maintenance time, i.e., without stopping an operation of a semiconductor manufacturing process chamber in case that pressure in the trapping apparatus and pressure in the process chamber are increased by space clogging or the like caused by reaction by-products accumulated in the trapping apparatus for trapping of a reaction by-product contained in exhaust gas discharged from the process chamber during a semiconductor process.

Description of the Related Art

In general, semiconductor manufacturing processes broadly include a pre-process (fabrication process) and a post-process (assembly process).

The pre-process refers to a process of manufacturing a semiconductor chip by forming particular patterns by repeatedly performing processes of depositing thin films on a wafer in various types of process chambers and selectively etching the deposited thin films.

In addition, the post-process refers to a package process of assembling a finished product by independently cutting and separating the chips manufactured on the wafer in the pre-process and coupling the chips to a lead frame.

The pre-process refers to a process of depositing the thin film on the wafer or etching the thin film deposited on the wafer. To this end, the semiconductor manufacturing process is performed at a high temperature by injecting a gas selected from various process gases including $TiCl_4$ (titanium tetrachloride), $NH_3$ (ammonia), $SiH_4$ (monosilane), $SiCl_2H_2$ (dichlorosilane), $WF_6$ (tungsten hexafluoride), Hf (hafnium), and the like into the process chamber depending on the required semiconductor manufacturing process. In this case, various types of non-deposited reaction by-products, unreacted ignitable gases, and harmful gases containing corrosive foreign substances and toxic substances are produced in large amount in the process chamber during the reaction process.

In order to remove and discharge the harmful gases, a semiconductor manufacturing facility is installed with a vacuum pump for creating a vacuum state in the process chamber that continuously operates, and a scrubber installed at a rear end of the vacuum pump and configured to purify exhaust gas discharged from the process chamber and then discharge the exhaust gas into the atmosphere.

However, because the scrubber purifies and treats only gaseous reaction by-products, the reaction by-product, which is discharged to the outside of the process chamber and then solidified, is adhered to an exhaust pipe, which causes problems of an increase in exhaust pressure, a breakdown of a vacuum pump caused by the reaction by-product introduced into the vacuum pump, and contamination of the wafer caused by a reverse flow of harmful gas into the process chamber.

For this reason, the semiconductor manufacturing facility is generally installed with a reaction by-product trapping apparatus installed between the process chamber and the vacuum pump to trap the reaction by-product contained in the exhaust gas discharged from the process chamber.

If the trapping apparatus cannot smoothly treat the exhaust gas introduced from the process chamber, the exhaust gas is introduced into the vacuum pump and the scrubber, which causes a breakdown of the pump and contamination of the wafer caused by a reverse flow of harmful gas into the process chamber during a high-quality, high-efficiency process of producing the wafer. Therefore, the trapping apparatus is a very important apparatus for the semiconductor production process.

In case that pressure in the trapping apparatus and pressure in the process chamber are increased because of space clogging or the like caused by the reaction by-product accumulated as the trapping apparatus performs the trapping operation for the above-mentioned purposes over a long period of time, the operation of the semiconductor production process cannot be performed. Therefore, a controller for controlling the process chamber facility stops a supply of process gas into the process chamber, and then the trapping apparatus is replaced.

When the operation of the process chamber is stopped by the controller for controlling the process chamber facility, a defect rate of a semiconductor in the process chamber. Therefore, the semiconductor is removed, and then a process of replacing or cleaning the trapping apparatus is performed.

The reason why the wafer is removed is that the wafer present in the process chamber and used to manufacture the semiconductor is contaminated and thus needs to be discarded because the trapping apparatus is detached after the process chamber at the front end and the exhaust pipe (or vacuum pipe) connected to the vacuum pump at the rear end are removed in the state in which the operations of the process chamber and the vacuum pump are stopped to replace or clean the trapping apparatus.

Thereafter, in case that the trapping apparatus is newly replaced, a process of connecting and remounting the process chamber at the front end and the vacuum pump at the rear end is performed.

In addition, an inner trapping tower installed in the trapping apparatus detached for the cleaning process is separated, and then the reaction by-product trapped or adhered in the inner trapping tower and a trapping apparatus housing are clearly removed. Thereafter, the process of connecting and remounting the process chamber at the front end and the vacuum pump at the rear end is performed on the cleaned trapping apparatus.

In this case, if the process chamber of the trapping apparatus operates immediately after the process chamber and the vacuum pump are connected, a vacuum condition, a condition related to presence or absence of foreign substances, or various types of conditions do not conform to a condition for optimal semiconductor production. Therefore, the trapping process is started after various types of inspection processes are performed.

About 48 hours are typically required to stop the operation of the process chamber facility, replace or clean the trapping apparatus, and set the optimal environmental condition, and then operate process chamber facility again.

As described above, because the process stop causes a large amount of time required for the semiconductor production process, there is a structural problem in that semiconductor production costs are increased.

Therefore, in the related art, a system has been proposed in which trapping apparatuses are provided as a dual system to continuously perform a semiconductor production process without stopping a process chamber facility, such that in case that one trapping apparatus cannot perform a normal trapping process, the other trapping apparatus operates, which is stopped, is replaced or cleaned, thereby enabling a continuous operation.

However, because two facilities and two installation spaces are required to provide the trapping apparatuses as the dual system, there is a problem in that it is difficult to reduce the semiconductor production costs.

DOCUMENTS OF RELATED ART

[Patent Documents]
(Patent Document 1) Korean Patent No. 10-0544320 (Jan. 11, 2006)
(Patent Document 2) Korean Patent No. 10-0647725 (Nov. 13, 2006)
(Patent Document 3) Korean Patent No. 10-0930320 (Nov. 30, 2009)
(Patent Document 4) Korean Patent Application Laid-Open No. 10-2022-0081116 (Jun. 15, 2022)

SUMMARY

An object to be achieved by the present disclosure is to provide a process stop loss reduction system, in which in case that pressure in a trapping apparatus and pressure in a process chamber are increased because of space clogging or the like caused by reaction by-products while the trapping apparatus for trapping of a reaction by-product contained in exhaust gas discharged from the process chamber operates over a long period of time during a semiconductor process, only the trapping apparatus, to which a supply of exhaust gas is cut off, may be quickly replaced while inert gas is received in an idle state and continuously supplied to a vacuum pump through a bypass pipe of the trapping apparatus without stopping an operation of (shutting down) a semiconductor manufacturing process chamber facility, and then the trapping apparatus may be supplied with the exhaust gas again.

Another object to be achieved by the present disclosure is to provide a process stop loss reduction system, in which a configuration capable of quickly replacing a reaction by-product trapping apparatus is provided, such that the trapping apparatus may be quickly replaced by controlling flow paths for supplying inert gas and exhaust gas in an idle state in which a semiconductor wafer manufacturing process environment is maintained in a process chamber without stopping an operation of (shutting down) a process chamber facility for manufacturing a semiconductor, and then the trapping apparatus may trap a reaction by-product contained in discharged exhaust gas by immediately inputting process gas into a process chamber again to proceed with a semiconductor manufacturing process without performing a process of resetting and evaluating an environmental condition for performing the semiconductor production process again and without performing a process of detaching or remounting a connection pipe between a vacuum pump and the process chamber connected to the trapping apparatus.

According to an aspect of the present disclosure, a process stop loss reduction system through rapid replacement of an apparatus for trapping of a reaction by-product for a semiconductor process includes a trapping apparatus configured to trap a reaction by-product contained in exhaust gas discharged from a process chamber during a semiconductor process, the process stop loss reduction system including: a direction switching valve configured to switch a flow path for exhaust gas or inert gas; a trapping apparatus having an inner trapping apparatus configured to receive the exhaust gas through the flow path switched by the direction switching valve and configured to trap the reaction by-product; a bypass pipe configured to receive the inert gas through the flow path switched by the direction switching valve and supply the inert gas to an exhaust pipe; a heating gate valve configured to receive any one of the exhaust gas and the inert gas from the trapping apparatus while performing an opening/closing operation and configured to supply any one of the exhaust gas and the inert gas to the exhaust pipe connected to a vacuum pump at a rear end or cut off the supply of any one of the exhaust gas and the inert gas; and a trapping system controller configured to set a flow path direction of the direction switching valve and control an operation of opening or closing the heating gate valve.

In the exemplary embodiment, the flow path of the direction switching valve may be automatically switched by the trapping system controller, such that the supplied exhaust gas is supplied to the trapping apparatus, or the supplied inert gas is supplied to the trapping apparatus or the bypass pipe.

In the exemplary embodiment, the trapping apparatus may be configured to receive the inert gas from the process chamber through the flow path switched by the direction switching valve, receive the exhaust gas, and then trap the reaction by-product after the trapping apparatus is replaced.

In the exemplary embodiment, the bypass pipe may be connected to the exhaust pipe at a lower side of the heating gate valve.

In the exemplary embodiment, the heating gate valve, at ordinary times, may prevent formation of a by-product in the valve by raising a temperature to allow the system to operate smoothly.

In the exemplary embodiment, the trapping system controller, at ordinary times, may perform control to allow the direction switching valve and the heating gate valve to communicate with the trapping apparatus through the flow paths, and when a process chamber facility controller detects a change in pressure in the trapping apparatus or the process chamber and then supplies the inert gas into the process chamber instead of process gas, the trapping system controller, which operates in conjunction with the process chamber facility controller in response to a signal, may perform control to switch the flow path of the direction switching valve to the bypass pipe from the trapping apparatus and supply the inert gas to the exhaust pipe at a lower side of the heating gate valve through the bypass pipe by closing the flow path of the heating gate valve, such that the trapping apparatus is capable of being replaced.

In the exemplary embodiment, when replacement of the trapping apparatus is completed, the trapping system controller may perform control to connect the heating gate valve in a closed state to the trapping apparatus to open a flow in the flow path of the heating gate valve, and switch the flow path of the direction switching valve to the trapping apparatus from the bypass pipe, such that the inert gas discharged from the process chamber is discharged to the vacuum pump at the rear end through the trapping apparatus, and then the process chamber may restart a process of producing a semiconductor, such that the trapping apparatus receives the exhaust gas, trap the reaction by-product, and then discharge the remaining exhaust gas, and the exhaust gas may be discharged to the vacuum pump at the rear end.

In the exemplary embodiment, the process stop loss reduction system through rapid replacement of an apparatus for trapping of a reaction by-product for a semiconductor process may be configured to replace the trapping apparatus in an idle state in which a semiconductor wafer manufacturing process environment is maintained in the process chamber in which a semiconductor wafer is being manufactured without stopping an operation of a process chamber facility.

According to the process stop loss reduction system through rapid replacement of an apparatus for trapping of a reaction by-product for a semiconductor process according to the present disclosure having the above-mentioned features, in case that the pressure in the trapping apparatus and the pressure in the process chamber are increased because of space clogging or the like caused by the reaction by-products while the trapping apparatus for trapping of a reaction by-product contained in exhaust gas discharged from the process chamber operates over a long period of time during the semiconductor process, only the trapping apparatus, to which a supply of exhaust gas is cut off, may be quickly replaced while inert gas is received in the idle state and continuously supplied to the vacuum pump through the bypass pipe of the trapping apparatus without stopping an operation of (shutting down) the semiconductor manufacturing process chamber facility, and then the trapping apparatus may trap the reaction by-product when the process gas is supplied to the process chamber again and the exhaust gas is discharged.

In addition, according to the process stop loss reduction system through rapid replacement of an apparatus for trapping of a reaction by-product for a semiconductor process according to the present disclosure, the configuration capable of quickly replacing the reaction by-product trapping apparatus is provided, such that the trapping apparatus may be quickly replaced by controlling flow paths for supplying inert gas and exhaust gas in the idle state in which the semiconductor wafer manufacturing process environment is maintained in a process chamber, which is being used to manufacture the semiconductor wafer, without stopping the operation of (shutting down) the process chamber facility for manufacturing a semiconductor, and then the trapping apparatus may trap a reaction by-product contained in discharged exhaust gas by immediately inputting process gas into the process chamber again to proceed with the semiconductor manufacturing process without performing a process of resetting and evaluating an environmental condition for performing the semiconductor production process again and without performing a process of detaching or remounting the connection pipe between the vacuum pump and the process chamber connected to the trapping apparatus.

In addition, according to the present disclosure, the semiconductor production process is quickly performed again within about three hours without stopping the operation of (shutting down) the process chamber facility, which makes it possible to improve the process operating time and the productivity by reducing the semiconductor stop loss time.

The present disclosure is a useful invention having many effects as described above and is an invention that is highly expected to be used in industry.

BRIEF DESCRIPTION OF THE DRAWINGS

The above and other aspects, features and other advantages of the present disclosure will be more clearly understood from the following detailed description taken in conjunction with the accompanying drawings, in which.

DETAILED DESCRIPTION OF THE EMBODIMENT

Hereinafter, configurations and operations of embodiments of the present disclosure will be described in detail with reference to the accompanying drawings. In addition, in the description of the present disclosure, the specific descriptions of related well-known functions or configurations will be omitted when it is determined that the specific descriptions may unnecessarily obscure the subject matter of the present disclosure.

Figure 1:
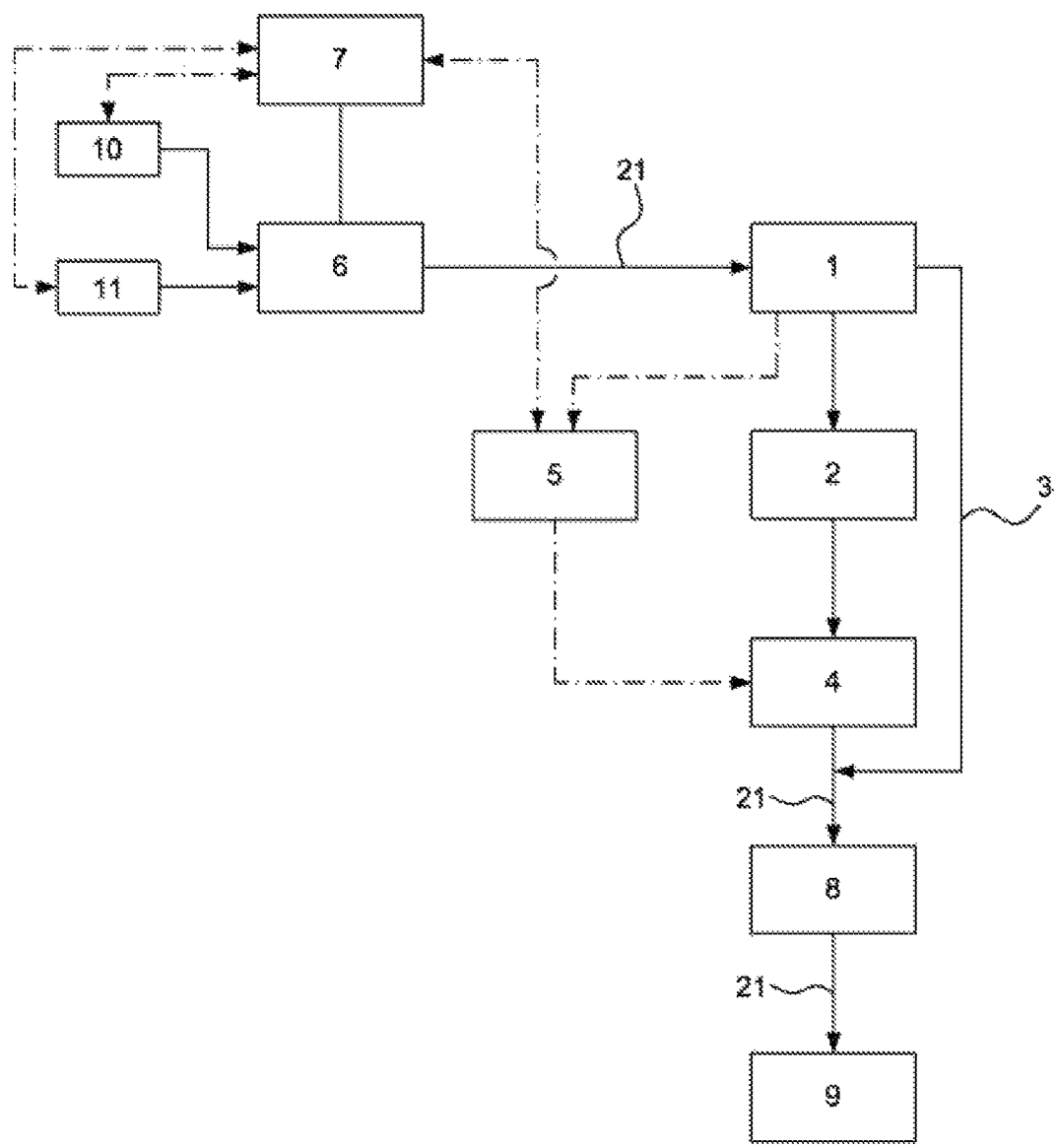
FIG. 1 is an overall configuration view of a process stop loss reduction system according to an embodiment of the present disclosure.
Figure 2:
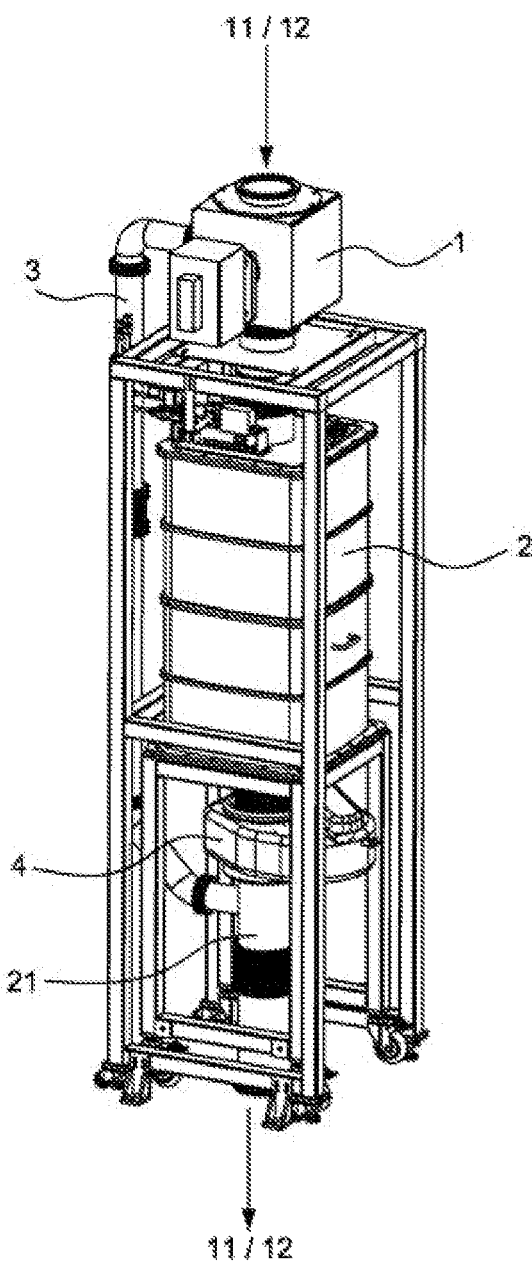
FIG. 2 is a perspective view illustrating configurations of a direction switching valve, a trapping apparatus, a bypass pipe, and a heating gate valve that constitute the process stop loss reduction system according to the embodiment of the present disclosure.
Figure 3:
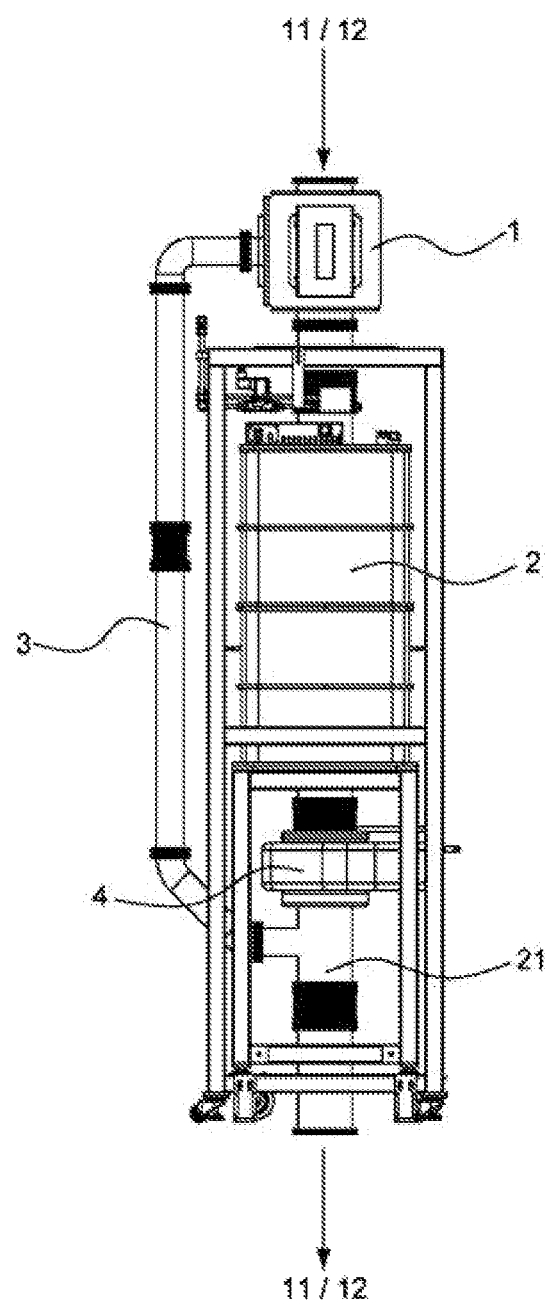
FIG. 3 is a front view illustrating the configurations of the direction switching valve, the trapping apparatus, the bypass pipe, and the heating gate valve that constitute the process stop loss reduction system according to the embodiment of the present disclosure.
Figure 4:
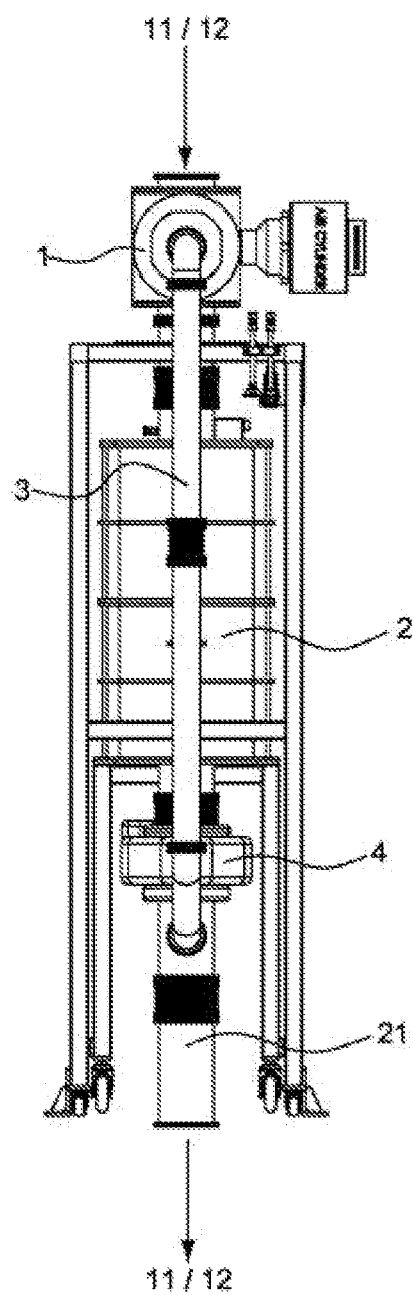
FIG. 4 is a side view illustrating the configurations of the direction switching valve, the trapping apparatus, the bypass pipe, and the heating gate valve that constitute the process stop loss reduction system according to the embodiment of the present disclosure.

FIG. 1 is an overall configuration view of a process stop loss reduction system according to an embodiment of the present disclosure, FIG. 2 is a perspective view illustrating configurations of a direction switching valve, a trapping apparatus, a bypass pipe, and a heating gate valve that constitute the process stop loss reduction system according to the embodiment of the present disclosure, FIG. 3 is a front view illustrating the configurations of the direction switching valve, the trapping apparatus, the bypass pipe, and the heating gate valve that constitute the process stop loss reduction system according to the embodiment of the present disclosure, and FIG. 4 is a side view illustrating the configurations of the direction switching valve, the trapping apparatus, the bypass pipe, and the heating gate valve that constitute the process stop loss reduction system according to the embodiment of the present disclosure.

Referring to the drawings, a process stop loss reduction system through rapid replacement of an apparatus for trapping of a reaction by-product for a semiconductor process according to the present disclosure includes: a the direction switching valve 1 configured to switch a flow path for exhaust gas 12 or inert gas 11; a trapping apparatus 2 having an inner trapping apparatus configured to receive the exhaust gas 12 through the flow path switched by the direction switching valve and trap a reaction by-product; a bypass pipe 3 configured to receive the inert gas through the flow path switched by the direction switching valve and supply the inert gas to a lower exhaust pipe at a lower side of a heating gate valve; a heating gate valve 4 configured to receive any one of the exhaust gas 12 and the inert gas from the trapping apparatus while performing an opening/closing operation and supply any one of the exhaust gas 12 and the inert gas to an exhaust pipe connected to a vacuum pump at a rear end and cut off the supply of any one of the exhaust gas 12 and the inert gas; and a trapping system controller 5 configured to set a flow path direction of the direction switching valve and control an operation of opening or closing the heating gate valve.

The exhaust gas 12 may contain various process gas components depending on a semiconductor to be manufactured in a process chamber. Examples of the gas components include $TiCl_4$, $NH_3$, $SiH_4$, $SiCl_2H_2$, $WF_6$, and Hf. However, the components of the exhaust gas 12 of the present disclosure are not limited to the above-mentioned gases.

As the inert gas used in the present disclosure, a gas, which is used for cleaning or ventilation and hardly chemically reacts with other substances, is used. Examples of the inert gas include $N_2$, Ar, and the like. However, the inert gas of the present disclosure are not limited to the above-mentioned gases.

The direction switching valve 1 is connected to a process chamber 6, which is used to manufacture a semiconductor, by means of an exhaust pipe and a bypass pipe. When a process chamber facility controller 7 detects a change in pressure in the trapping apparatus, the flow path of the direction switching valve 1 is automatically switched by the trapping system controller 5 so that the exhaust gas 12 or the inert gas 11, which is selectively supplied, is supplied to any one of the trapping apparatus and the bypass pipe. That is, the direction switching valve 1 is configured to supply the exhaust gas, which is supplied from the process chamber 6, to the trapping apparatus 2 or supply the inert gas, which is supplied from the process chamber 6, to the trapping apparatus 2 or the bypass pipe 3.

The direction switching valve 1 is configured as a three-way valve having a structure that may have three flow paths in the valve and close one flow path at a discharge port side while opening the other flow paths by automatically switching the flow path in a direction of a supply side, thereby supplying the gas, which is supplied through the exhaust pipe, to the flow path in the selected direction. In this case, the direction switching valve is configured as an automatic valve that performs a flow path switching function automatically instead of manually. To this end, the direction switching valve may configured to use a motor or a pneumatic cylinder and quickly change the flow path when the motor or the pneumatic cylinder is operated under the control of the trapping controller.

The reason why the direction switching valve is automatically operated is that the flow path needs to be quickly changed at the same time when the process chamber facility controller 7 detects a change in pressure in the trapping apparatus so that a semiconductor wafer, which is being manufactured in the process chamber, is not contaminated by introduced foreign substances or an optimally preset semiconductor production process condition is not changed. However, as necessary, the direction switching valve may be manually controlled.

That is, the process chamber 6, which is connected to the trapping apparatus 2 through the direction switching valve 1, refers to a device for manufacturing a semiconductor chip by processing particular patterns by repeatedly performing a process of depositing a thin film on a wafer by using the introduced reactant gas and selectively etching the deposited thin film. The process chamber facility controller 7 detects the pressure in the trapping apparatus or the pressure in the process chamber and supplies the exhaust gas 12 or the inert gas to the process chamber 6 so that the process chamber 6 stably performs the process.

The reason why the process chamber facility controller 7 detects a change in pressure in the trapping apparatus 2 is to prevent the problem in that when the exhaust gas 12 is not smoothly discharged and trapped because of space clogging or the like caused by the reaction by-product accumulated as the trapping process is performed over a long period of time, the trapping apparatus 2 cannot perform the normal trapping process, a load is generated, an internal pressure increases, the pressure in the process chamber connected to the trapping apparatus 2 through an exhaust pipe 21 also increases, the optimal semiconductor production condition is affected, and a reverse flow of harmful gas into the process chamber contaminates the wafer being manufactured by a high-quality, high-efficiency process.

Non-illustrated pressure detection sensors are installed at one or more positions in the exhaust pipe, the process chamber, and the trapping apparatus so that the process chamber facility controller 7 detects the pressure change.

The trapping apparatus 2 is installed at the rear end of the direction switching valve 1. At ordinary times, the trapping apparatus 2 is connected to the direction switching valve 1 through the flow path, such that the trapping apparatus 2 receives the exhaust gas 12 discharged from the process chamber 6, traps the reaction by-product, and discharges only the remaining exhaust gas 12 to the vacuum pump connected to the exhaust pipe 21 at the rear end. Thereafter, a scrubber serves to purify the exhaust gas 12 and then discharge the exhaust gas 12 through the exhaust pipe 21.

In addition, during a process of replacing the trapping apparatus 2, the flow path of the direction switching valve 1 is closed, and the supply of the exhaust gas 12 is cut off.

In addition, after the trapping apparatus 2 is completely replaced, the heating gate valve 4 at the rear end is opened again, the heating gate valve 4 communicates with the exhaust pipe 21 of the vacuum pump through the flow path, and the flow paths are connected through the flow path switched by the direction switching valve 1 at the front end. Therefore, the trapping apparatus 2 receives the inert gas, which is discharged from the process chamber 6, and discharge the inert gas to the vacuum pump at the rear end before the trapping apparatus 2 receives the exhaust gas 12. Next, when the process chamber 6 restarts the process of producing the semiconductor, the trapping apparatus 2 receives the discharged exhaust gas 12 and traps the reaction by-product.

The trapping apparatus used in the present disclosure is not limited in structure or shape, and various trapping apparatuses may be mounted and connected.

For example, any one of inner trapping towers each having any one of structures having a combination of various trapping plates may be provided in a housing that constitutes the trapping apparatus. Further, the structure may trap the reaction by-product contained in the exhaust gas 12. A heater, which serves to set an appropriate temperature to trap the reaction by-product and prevent clogging of an inlet part of the trapping apparatus by maintaining a temperature of the exhaust gas, may be or may not be used for the provided trapping apparatus depending on the situation. In addition, a cooling means may be selectively provided in the housing or the inner trapping apparatus, such that a means capable of adjusting the internal temperature is provided.

The bypass pipe 3 is maintained in a state in which the flow path thereof is closed by the direction switching valve when the trapping apparatus normally performs the trapping operation. When the process chamber facility controller 7 detects a change in pressure in the trapping apparatus or the process chamber and supplies the inert gas into the process chamber instead of the process gas, the trapping system controller 5 circuit-connected to the process chamber facility controller 7 switches the flow path of the direction switching valve 1 at the same time so that the flow path of the direction switching valve 1 communicates with the exhaust pipe 21 positioned at the lower side of the heating gate valve 4 positioned at the rear end of the trapping apparatus, such that the inert gas flows to the vacuum pump through the exhaust pipe 21.

The inert gas, which is supplied through the bypass pipe 3, flows to the vacuum pump and the scrubber for the time for which the trapping apparatus is replaced, such that the operations of the vacuum pump and the scrubber are maintained.

The inert gas is supplied into the process chamber from an inert gas storage tank (not illustrated) by the process chamber facility controller 7 while the inert gas is supplied through the bypass pipe 3 of the present disclosure, i.e., while the trapping apparatus is replaced. In this case, the semiconductor, which is being manufactured in the process chamber is not removed, and the process is in a stopped (idling→idle) state for a moment until the replacement of the trapping apparatus is completed. Therefore, because all the process conditions are not changed, the semiconductor manufacturing process is continuously performed when only the process gas is supplied. Because the time required to replace the trapping apparatus is typically about three hours or less, the idle time of about three hours is required in case that the present disclosure system is applied.

The bypass pipe 3 may be configured as a metal pipe and fixed. Alternatively, the bypass pipe 3 may be configured as a flexible pipe and freely disposed.

The heating gate valve 4 is configured to block the flow in the flow path connected to the trapping apparatus by the trapping system controller 5 when the process chamber facility controller 7 detects a change in pressure in the trapping apparatus or the process chamber and then supplies the inert gas into the process chamber instead of the process gas.

In addition, when the replacement of the trapping apparatus is completed, the heating gate valve 4 in the closed state is opened, the flow path of the bypass pipe 3 connected to the direction switching valve 1 is switched to the direction of the trapping apparatus by the trapping system controller 5, and at the same time, the trapping apparatus side flow path in the closed state is opened and connected to the trapping apparatus, such that the trapping apparatus receives the inert gas discharged from the process chamber 6 and discharge the inert gas to the vacuum pump at the rear end. Thereafter, the process chamber 6 restarts the process of producing the semiconductor, and the trapping apparatus receives the exhaust gas 12, traps the reaction by-product, and then discharges the remaining exhaust gas 12, such that the exhaust gas 12 is supplied to the exhaust pipe 21 connected to the scrubber and the vacuum pump at the rear end.

In addition, at ordinary times, the heating gate valve 4 is configured to increase the temperature to prevent the formation of the by-product in the valve and allow the system to operate smoothly when the replacement of the trapping apparatus is not performed. That is, the heating gate valve 4 is opened to communicate with the trapping apparatus, and the exhaust gas 12 is discharged through a discharge port of the trapping apparatus in the state in which the reaction by-product has been trapped as the exhaust gas passes through the trapping apparatus. In this case, the exhaust gas 12, which is heated again and has a raised temperature, is supplied to the scrubber through the vacuum pump at the rear end while being prevented from being adhered in the exhaust pipe 21 and the valve.

At ordinary times, the trapping system controller 5 performs control to allow the direction switching valve 1 and the heating gate valve 4 to communicate with the trapping apparatus through the flow paths. When the process chamber facility controller 7 detects a change in pressure in the trapping apparatus or the process chamber and then supplies the inert gas into the process chamber instead of the process gas, the trapping system controller, which operates in conjunction with the process chamber facility controller in response to a signal, switches the flow path of the direction switching valve 1 to the bypass pipe of the trapping apparatus and blocks the flow path of the heating gate valve 4 so that the inert gas is supplied to the exhaust pipe 21 at the lower side of heating gate valve through the bypass pipe 3.

The trapping apparatus 2 is quickly replaced as the trapping system controller 5 controls the flow path.

In addition, when the replacement of the trapping apparatus is completed, the trapping system controller 5 performs control to switch the flow path of the direction switching valve 1 to the direction of the trapping apparatus from the bypass pipe and open the flow in the flow path so that the heating gate valve 4 in the closed state is also connected to the trapping apparatus.

Therefore, when the direction switching valve 1 and the heating gate valve 4 communicate with the trapping apparatus 2, the inert gas discharged from the process chamber 6 is discharged to the vacuum pump at the rear end through the trapping apparatus 2. Thereafter, when the process chamber 6 restarts the process of producing the semiconductor, the trapping apparatus receives the exhaust gas 12, traps the reaction by-product, and then supplies the remaining exhaust gas 12 to the exhaust pipe 21 connected to the scrubber and the vacuum pump at the rear end.

Figure 5:
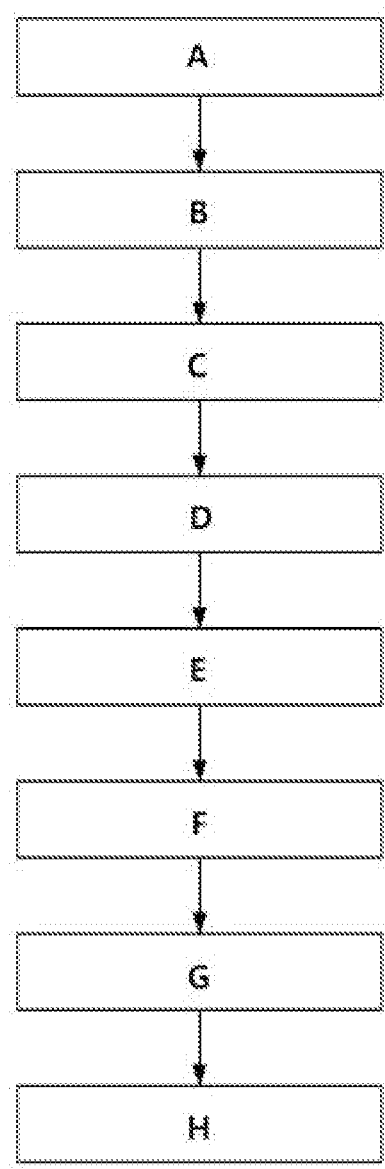
FIG. 5 is a flowchart illustrating a trapping method using the process stop loss reduction system according to the embodiment of the present disclosure.

FIG. 5 is a flowchart illustrating a trapping method using the process stop loss reduction system according to the embodiment of the present disclosure. After the process stop loss reduction system according to FIGS. 1 to 4 is provided, the trapping method performs the following steps of:

(A) performing the semiconductor manufacturing process in the process chamber;

(B) detecting pressure in the process chamber;

(C) switching the semiconductor manufacturing process to the idling state and then supplying the inert gas into the process chamber;

(D) supplying, by the trapping controller, the inert gas to the bypass pipe by switching the direction switching valve and controlling the operation of closing the heating gate valve;

(E) replacing the trapping apparatus;

(F) supplying, by trapping controller, the inert gas into the trapping apparatus by switching the direction switching valve and controlling the operation of opening the heating gate valve;

(G) performing the semiconductor manufacturing process by inputting the process gas into the process chamber; and (H) proceeding with, by the trapping apparatus, the process of trapping the reaction by-product contained in the exhaust gas discharged from the process chamber.

According to the present disclosure, as the above-mentioned steps are performed, it is possible to proceed with the semiconductor production process by quickly replacing the trapping apparatus without a process stop loss such as preparation of replacement of the trapping apparatus and replacement and maintenance time, i.e., without stopping the operation of the semiconductor manufacturing process chamber in case that the pressure in the trapping apparatus and the pressure in the process chamber are increased by space clogging or the like caused by reaction by-products accumulated in the trapping apparatus for trapping of a reaction by-product contained in exhaust gas discharged from the process chamber during the semiconductor process.

The present disclosure is not limited to the specific exemplary embodiment described above, various modifications can be made by any person skilled in the art to which the present disclosure pertains without departing from the subject matter of the present disclosure as claimed in the claims, and the modifications are within the scope defined by the claims.

What is claimed is:

1. A process stop loss reduction system through rapid replacement of an apparatus for trapping of a reaction by-product for a semiconductor process, comprising:
    a direction switching valve (1) configured to switch a flow path for exhaust gas or inert gas discharged from a process chamber;
    a trapping apparatus (2) having an inner trapping apparatus configured to receive the exhaust gas and trap a reaction by-product;
    a process chamber facility controller (7) configured to detect a change in pressure in the process chamber and the trapping apparatus;
    a heating gate valve (4) configured to receive any one of the exhaust gas and the inert gas from the trapping apparatus and supply any one of the exhaust gas and the inert gas to an exhaust pipe connected to a vacuum pump at a rear end, wherein the heating gate valve (4) is configured to heat any one of the exhaust gas and the inert gas passing therethrough to prevent the by-product from forming in the heating gate valve;
    a bypass pipe (3) configured to receive the inert gas through the direction switching valve (1) and supply the inert gas to the exhaust pipe; and
    a trapping system controller (5) configured to communicate with the process chamber facility controller (7) and control the direction switching valve and the heating gate valve,
    wherein the trapping system controller (5) controls the direction switching valve (1) and the heating gate valve (4), while the process chamber and the trapping apparatus are operating in normal state, to open the flow path through the direction switching valve (1), the trapping apparatus (2) and the heating gate valve (4), and closes the flow path through the bypass pipe (3) such that the trapping apparatus (2) is configured to receive the exhaust gas, and
    wherein the trapping system controller (5) controls the direction switching valve (1) and the heating gate valve (4), when a signal is received from the process chamber facility controller (7) that the pressure in the process chamber and the trapping apparatus is increased, to close the flow path through the direction switching valve (1), trapping apparatus (2) and the heating gate valve (4), and open the flow path through the bypass pipe (3) such that the bypass pipe (3) is configured to receive the inert gas.

2. The process stop loss reduction system of claim 1, wherein the trapping apparatus (2) is configured to receive the inert gas from the process chamber (6) through the flow path switched by the direction switching valve, receive the exhaust gas, and then trap the reaction by-product after the trapping apparatus (2) is replaced.

3. The process stop loss reduction system of claim 1, wherein the bypass pipe (3) is connected to the exhaust pipe at a lower side of the heating gate valve.

4. The process stop loss reduction system of claim 1, wherein when replacement of the trapping apparatus is completed, the trapping system controller (5) performs control to connect the heating gate valve in a closed state to the trapping apparatus to open a flow in the flow path of the heating gate valve, and switch the flow path of the direction switching valve to the trapping apparatus from the bypass pipe, such that the inert gas discharged from the process chamber (6) is discharged to the vacuum pump at the rear end through the trapping apparatus (2), and then the process chamber (6) restarts a process of producing a semiconductor, such that the trapping apparatus receives the exhaust gas, traps the reaction by-product, and then discharges the remaining exhaust gas, and the exhaust gas is discharged to the vacuum pump at the rear end.

5. The process stop loss reduction system of claim 1, wherein the process stop loss reduction system through rapid replacement of an apparatus for trapping of a reaction by-product for a semiconductor process is configured to replace the trapping apparatus in an idle state in which a semiconductor wafer manufacturing process environment is maintained in the process chamber in which a semiconductor wafer is being manufactured without stopping an operation of a process chamber facility.

6. The process stop loss reduction system of claim 1, wherein the direction switching valve (1), the trapping apparatus (2), the heating gate valve (4), and the exhaust pipe (21) are disposed in order from top to bottom.

* * * * *